(12) United States Patent
Martin et al.

(10) Patent No.: US 10,833,701 B2
(45) Date of Patent: Nov. 10, 2020

(54) PROCESS AWARE DATA COMPRESSION

(71) Applicant: EMC IP Holding Company LLC, Hopkinton, MA (US)

(72) Inventors: Owen Martin, Hopedale, MA (US); Felix Shvaiger, Brighton, MA (US); Arieh Don, Newton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 233 days.

(21) Appl. No.: 15/969,099

(22) Filed: May 2, 2018

(65) Prior Publication Data

US 2019/0341928 A1 Nov. 7, 2019

(51) Int. Cl.
*G06F 7/00* (2006.01)
*H03M 7/30* (2006.01)
*G06F 16/23* (2019.01)

(52) U.S. Cl.
CPC .......... *H03M 7/30* (2013.01); *G06F 16/2365* (2019.01)

(58) Field of Classification Search
CPC .. H03M 7/30; G06F 16/2365; G06K 9/00208; G06K 9/46; G06K 9/4661; G06K 9/00637; G06K 9/00476; G06K 9/52; G06K 9/6215

See application file for complete search history.

(56) References Cited

U.S. PATENT DOCUMENTS

| 10,203,897 | B1* | 2/2019 | Cheah | G06F 3/0638 |
| 2017/0139947 | A1* | 5/2017 | Abed | G06F 16/1744 |
| 2019/0044531 | A1* | 2/2019 | Guilford | G06F 12/0864 |

* cited by examiner

*Primary Examiner* — Azam M Cheema
(74) *Attorney, Agent, or Firm* — Muirhead and Saturnelli, LLC

(57) ABSTRACT

Determining an expected compression rate for a prospective process in a federated system includes obtaining compression rate data for existing processes in the federated system, compiling the compression rate data into a plurality of entries in a process name table according to process identifier, client, and industry, determining a specific entry in the process name table for an existing process that most closely matches the prospective process, and determining an expected compression rate of the prospective process based on the compression rate data for the specific entry. Compression rate data may be provided by a driver at host systems that sends compression rate information to a central repository. The central repository may be provided by a host system at a data center of the federated system. The compression rate data may use a sliding average that weighs the data more heavily to favor more recent data.

20 Claims, 7 Drawing Sheets

PROCESS AWARE DATA COMPRESSION

TECHNICAL FIELD

This application relates to the field of computer systems and storage devices therefor and, more particularly, to determining expected data compression for data written to storage devices.

BACKGROUND OF THE INVENTION

Host processor systems may store and retrieve data using a storage device containing a plurality of host interface units (I/O modules), disk drives, and disk interface units (disk adapters). The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to any one of the actual disk drives. Allowing multiple host systems to access the single storage device unit allows the host systems to share data stored therein.

Data reduction techniques enable a storage array to make a tradeoff between the effort of reducing the data in a reliable fashion (i.e., overhead for the compression) and the benefit of achieving a higher effective capacity utilization. Users may be faced with a decision to deploy data reduction on a particular process or not. The decision may be based on a balancing of the expected benefits of data reduction with the risk to performance that providing data reduction might cause. However, in many cases it may be difficult or impossible to predict an amount of data compression that will be realized by a particular process and so, in connection with balancing overhead with expected compression rate, the user needs to estimate the expected compression rate without any quantitative basis. Of course, the user could always run a process to determine the compression rate that is achieved, but doing so may be impractical in a large system that deploys hundreds of processes.

Accordingly, it is desirable to provide a mechanism for determining an expected compressibility of data for a prospective processes based on empirical information without needing to run a prospective process beforehand.

SUMMARY OF THE INVENTION

According to the system described herein, determining an expected compression rate for a prospective process in a federated system includes obtaining compression rate data for existing processes in the federated system, compiling the compression rate data into a plurality of entries in a process name table according to process identifier, client, and industry, determining a specific entry in the process name table for an existing process that most closely matches the prospective process, and determining an expected compression rate of the prospective process based on the compression rate data for the specific entry. Compression rate data may be provided by a driver at host systems that sends compression rate information to a central repository. The central repository may be provided by a host system at a data center of the federated system. Matching an entry in the process name table may include matching a process identifier and matching a client. In response to there being no matching process, an entry in the process name table having a closest process to the prospective process may be chosen. Matching an entry in the process name table may include matching a process identifier and matching an industry. In response to there being no matching industry, an entry in the process name table having a closest industry to that of the prospective process may be chosen. The compression rate data may use a sliding average that weighs the data more heavily to favor more recent data. The compression rate data may be provided as histogram data. The expected compression rate may be based on a mode of histogram data.

According further to the system described herein, a non-transitory computer readable medium contains software that determines an expected compression rate for a prospective process in a federated system. The software includes executable code that obtains compression rate data for existing processes in the federated system, executable code that compiles the compression rate data into a plurality of entries in a process name table according to process identifier, client, and industry, executable code that determines a specific entry in the process name table for an existing process that most closely matches the prospective process, and executable code that determines an expected compression rate of the prospective process based on the compression rate data for the specific entry. Compression rate data may be provided by a driver at host systems that sends compression rate information to a central repository. The central repository may be provided by a host system at a data center of the federated system. Matching an entry in the process name table may include matching a process identifier and matching a client. In response to there being no matching process, an entry in the process name table having a closest process to the prospective process may be chosen. Matching an entry in the process name table may include matching a process identifier and matching an industry. In response to there being no matching industry, an entry in the process name table having a closest industry to that of the prospective process may be chosen. The compression rate data may use a sliding average that weighs the data more heavily to favor more recent data. The compression rate data may be provided as histogram data. The expected compression rate may be based on a mode of histogram data.

This system described herein provides a mechanism whereby compression rates of existing processes predicts compression rates of prospective processes, thus eliminating the need to individually manage each prospective process to choose data compression prior to having any empirical data on which to base the choice. This frees a user from having to determine for themselves whether data reduction will be effective or not for thousands of individual processes that might be resident in a system.

BRIEF DESCRIPTION OF THE DRAWINGS

Embodiments of the system are described with reference to the several figures of the drawings, noted as follows.

DETAILED DESCRIPTION OF VARIOUS EMBODIMENTS

Figure 1:
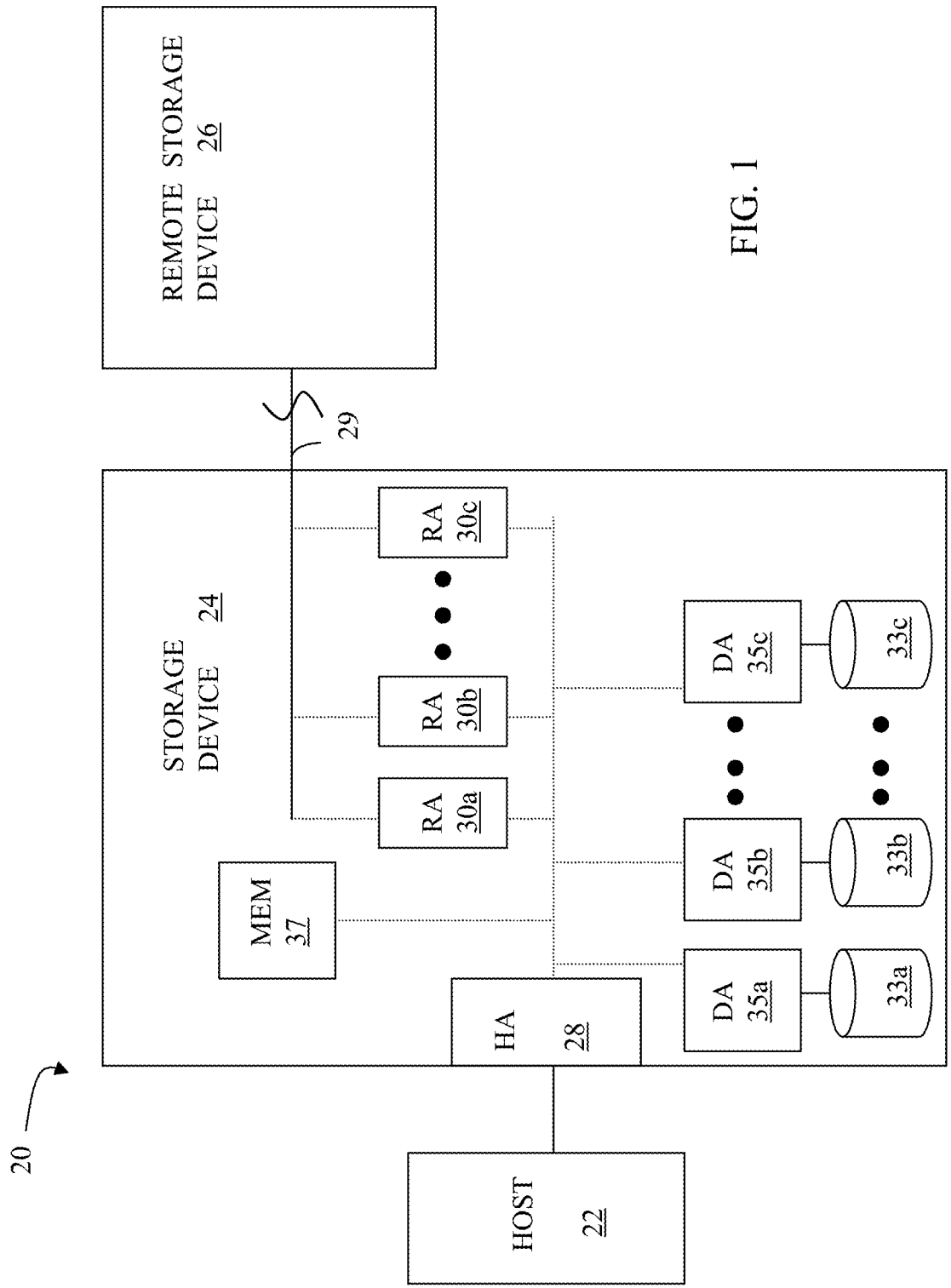
FIG. 1 is a schematic illustration of a storage system showing a relationship between a host and a storage device that may be used in connection with an embodiment of the system described herein.

FIG. 1 is a schematic illustration of a storage system 20 showing a relationship between a host 22 and a storage device 24 that may be used in connection with an embodiment of the system described herein. In an embodiment, the storage device 24 may be a Symmetrix or VMAX storage system produced by Dell EMC of Hopkinton, Mass.; however, the system described herein may operate with other appropriate types of storage devices. Also illustrated is another (remote) storage device 26 that may be similar to, or different from, the storage device 24 and may, in various embodiments, be coupled to the storage device 24, for example, via a network. The host 22 reads and writes data from and to the storage device 24 via an HA 28 (host adapter), which facilitates an interface between the host 22 and the storage device 24. Although the diagram 20 only shows one host 22 and one HA 28, it will be appreciated by one of ordinary skill in the art that multiple host adaptors (possibly of different configurations) may be used and that one or more HAs may have one or more hosts coupled thereto.

In an embodiment of the system described herein, in various operations and scenarios, data from the storage device 24 may be copied to the remote storage device 26 via a link 29. For example, the transfer of data may be part of a data mirroring or replication process that causes data on the remote storage device 26 to be identical to the data on the storage device 24. Although only the one link 29 is shown, it is possible to have additional links between the storage devices 24, 26 and to have links between one or both of the storage devices 24, 26 and other storage devices (not shown). The storage device 24 may include a first plurality of remote adapter units (RA's) 30a, 30b, 30c. The RA's 30a-30c may be coupled to the link 29 and be similar to the HA 28, but are used to transfer data between the storage devices 24, 26.

The storage device 24 may include one or more disks (including solid state units and/or other types of storage units), each containing a different portion of data stored on each of the storage device 24. FIG. 1 shows the storage device 24 having a plurality of disks 33a, 33b, 33c. The storage device (and/or remote storage device 26) may be provided as a stand-alone device coupled to the host 22 as shown in FIG. 1 or, alternatively, the storage device 24 (and/or remote storage device 26) may be part of a storage area network (SAN) that includes a plurality of other storage devices as well as routers, network connections, etc. (not shown). The storage devices may be coupled to a SAN fabric and/or be part of a SAN fabric. The system described herein may be implemented using software, hardware, and/or a combination of software and hardware where software may be stored in a computer readable medium and executed by one or more processors.

Each of the disks 33a-33c may be coupled to a corresponding disk adapter unit (DA) 35a, 35b, 35c that provides data to a corresponding one of the disks 33a-33c and receives data from a corresponding one of the disks 33a-33c. An internal data path exists between the DA's 35a-35c, the HA 28 and the RA's 30a-30c of the storage device 24. Note that, in other embodiments, it is possible for more than one disk to be serviced by a DA and that it is possible for more than one DA to service a particular disk. The storage device 24 may also include a global memory 37 that may be used to facilitate data transferred between the DA's 35a-35c, the HA 28 and the RA's 30a-30c. The memory 37 may contain tasks that are to be performed by one or more of the DA's 35a-35c, the HA 28 and/or the RA's 30a-30c, and may contain a cache for data fetched from one or more of the disks 33a-33c.

The storage space in the storage device 24 that corresponds to the disks 33a-33c may be subdivided into a plurality of volumes or logical devices. The logical devices may or may not correspond to the physical storage space of the disks 33a-33c. Thus, for example, the disk 33a may contain a plurality of logical devices or, alternatively, a single logical device could span both of the disks 33a, 33b. Similarly, the storage space for the remote storage device 26 may be subdivided into a plurality of volumes or logical devices, where each of the logical devices may or may not correspond to one or more disks of the remote storage device 26.

Figure 2:
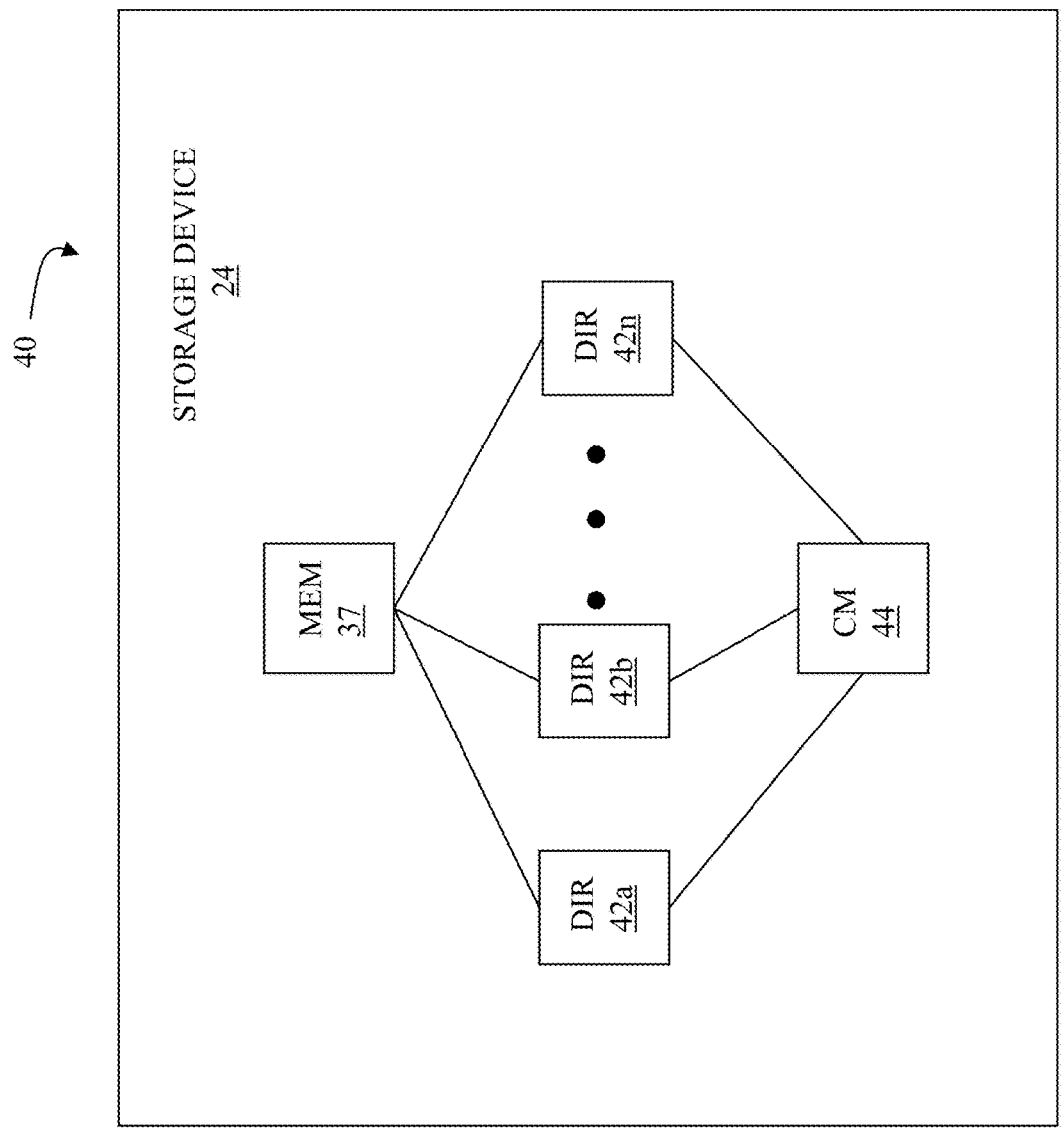
FIG. 2 is a schematic diagram illustrating an embodiment of the storage device where each of a plurality of directors are coupled to the memory.

FIG. 2 is a schematic diagram 40 illustrating an embodiment of the storage device 24 where each of a plurality of directors 42a-42n are coupled to the memory 37. Each of the directors 42a-42n represents at least one of the HA 28, RAs 30a-30c, or DAs 35a-35c. The diagram 40 also shows an optional communication module (CM) 44 that provides an alternative communication path between the directors 42a-42n. Each of the directors 42a-42n may be coupled to the CM 44 so that any one of the directors 42a-42n may send a message and/or data to any other one of the directors 42a-42n without needing to go through the memory 26. The CM 44 may be implemented using conventional MUX/router technology where a sending one of the directors 42a-42n provides an appropriate address to cause a message and/or data to be received by an intended receiving one of the directors 42a-42n. Some or all of the functionality of the CM 44 may be implemented using one or more of the directors 42a-42n so that, for example, the directors 42a-42n may be interconnected directly with the interconnection functionality being provided on each of the directors 42a-42n. In addition, a sending one of the directors 42a-42n may be able to broadcast a message to all of the other directors 42a-42n at the same time.

In some embodiments, one or more of the directors 42a-42n may have multiple processor systems thereon and thus may be able to perform functions for multiple directors. In some embodiments, at least one of the directors 42a-42n having multiple processor systems thereon may simultaneously perform the functions of at least two different types of directors (e.g., an HA and a DA). Furthermore, in some embodiments, at least one of the directors 42a-42n having multiple processor systems thereon may simultaneously perform the functions of at least one type of director and perform other processing with the other processing system. In addition, all or at least part of the global memory 37 may be provided on one or more of the directors 42a-42n and shared with other ones of the directors 42a-42n. In an embodiment, the features discussed in connection with the storage device 24 may be provided as one or more director boards having CPUs, memory (e.g., DRAM, etc.) and interfaces with Input/Output (I/O) modules.

Figure 3:
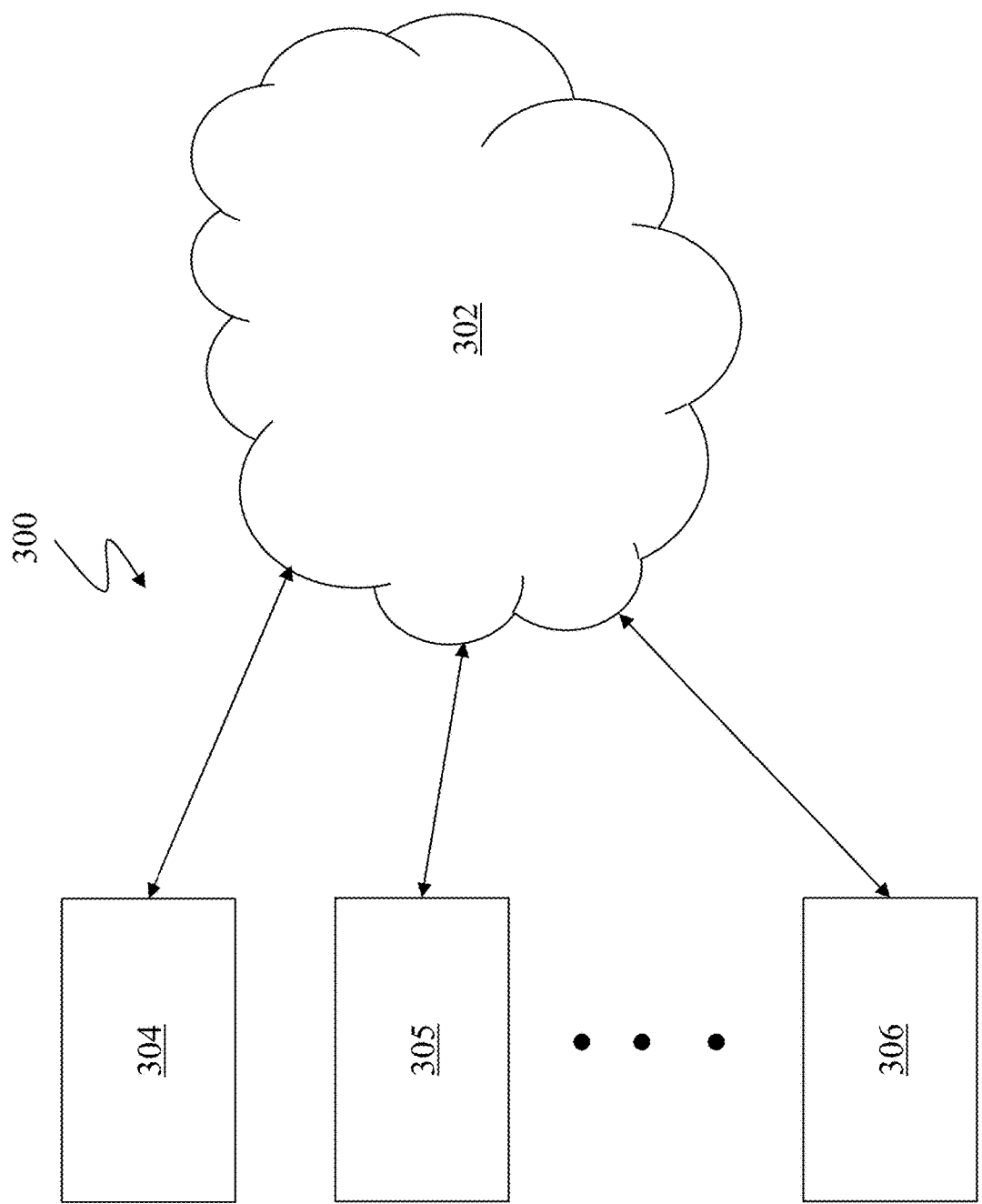
FIG. 3 is a schematic illustration showing a federated system with a plurality of data centers coupled together by a network according to an embodiment of the system described herein.

Referring to FIG. 3, a diagram 300 illustrates a federated system that includes a network 302, such as the Internet, that connects a plurality of data centers 304-306. The data centers 304-306 may be geographically disperse and there may be any number of data centers. Each of the data centers 304-306 may contain one or more host systems, like the host 22, discussed above, and may contain one or more storage devices, like the storage device 24, discussed above. In some cases, a host system accesses data on one or more storage devices that are co-located. That is, the host system and the corresponding storage device(s) accessed by the host system are located at a same one of the data centers 304-306. In other instances, host system(s) from one of the data centers 304-306 may access one or more storage devices at other ones of the data centers 304-306. As discussed in more detail elsewhere herein, mechanisms provided at various hosts in the data centers 304-306 may be used to keep track of and accumulate relevant data to determine effectiveness of data compression on different types of data from different sources (processes).

It is possible to spread an application across many different storage devices in one of the data centers 304-306 and to spread an application across different ones of the data centers 304-306. It is also possible to use multiple ones of the data centers 304-306 to ensure that applications are collocated with business demand. For example, a customer might have a data center in New York City for the NYSE and another data center in London for the London Stock Exchange.

Figure 4:
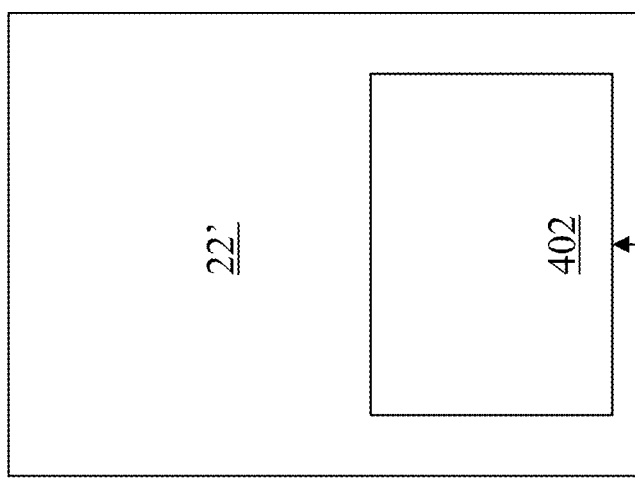
FIG. 4 is a schematic diagram illustrating a host system having a driver that accumulates information about data compression for data written by the host system according to an embodiment of the system described herein.

Referring to FIG. 4, a host system 22' is shown as including a driver 402 that accumulates information about data compression for data written by the host system 22'. The host system 22' may be provided in one of the data centers 304-306 (not shown in FIG. 4). The driver 402 accumulates information including an amount of data compression achieved when the host system 22' writes data to a storage device (not shown in FIG. 4). The driver 402 also accumulates an identifier of a process that wrote the data, a client (the runs/owns the process) that wrote the data, and an industry (e.g., finance, manufacturing, health care, etc.) of the client. In an embodiment herein, write operations may be tagged to associate the desired information with the write operation. As described in more detail elsewhere herein, the information is provided to a central repository that accumulates the data from the driver 402 and provides systemwide information about data compression that may be used to determine whether to perform data compression for subsequent data/clients.

Figure 5:
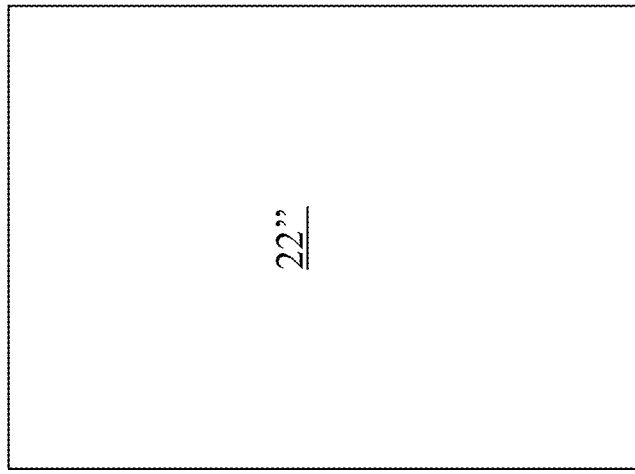
FIG. 5 is a schematic diagram illustrating a host system that receives compression information collected by drivers of other host systems according to an embodiment of the system described herein.

Referring to FIG. 5, a host system 22" is coupled to the network and receives, from the other host systems like the host system 22', the information collected by the drivers of the host systems (described above) including the amount of data compression achieved for each write operation and the process, client, and industry that performed each write operation. The host system 22" acts as a central repository of compression data for the federated system and may be provided in one of the data centers 304-306 (not shown in FIG. 4). The host system 22" uses the collected information to generate a plurality of histograms, each of which represents compression levels achieved based on process, client, and industry. The histograms are described in more detail elsewhere herein. The histograms may be used to make subsequent decisions regarding whether to compress particular data in a prospective process.

Figure 6:
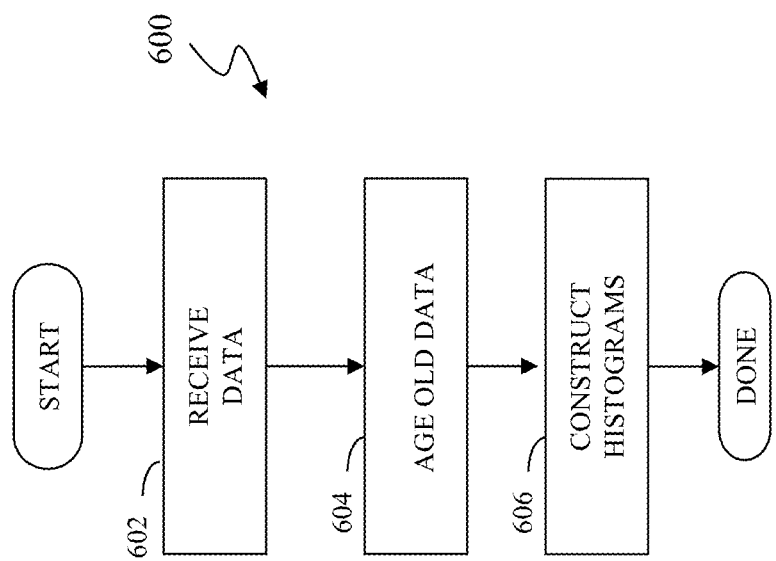
FIG. 6 is a flow diagram illustrating processing performed in connection with a host system receiving data indicative of an amount of data compression achieved according to an embodiment of the system described herein.

Referring to FIG. 6, a flow diagram 600 illustrates processing performed in connection with the host system 22" receiving data indicative of an amount of data compression achieved, an identifier of a process that wrote the data, a client that wrote the data, and an industry (e.g., finance, manufacturing, health care, etc.) of the client. Processing begins at a first step 602 where the host system 22" receives data from one of the hosts systems in the federated system, as described elsewhere herein. Following the step 602 is a step 604 where the previous data is aged. In an embodiment herein, a sliding average of the data is maintained where an influence of older data is diminished by weighting the data more heavily to favor more recent data. In an embodiment herein, current data is halved every five days, but of course any appropriate mechanism may be used to age older data. Following the step 604 is a step 606 where the data received at the step 602 and the data from previous iterations that was aged at the step 604 is combined to provide histograms, as described in more detail elsewhere herein.

Figure 7C:
FIGS. 7A-7C are histograms illustrating compression distributions for different processes according to an embodiment of the system described herein.
Figure 7B:
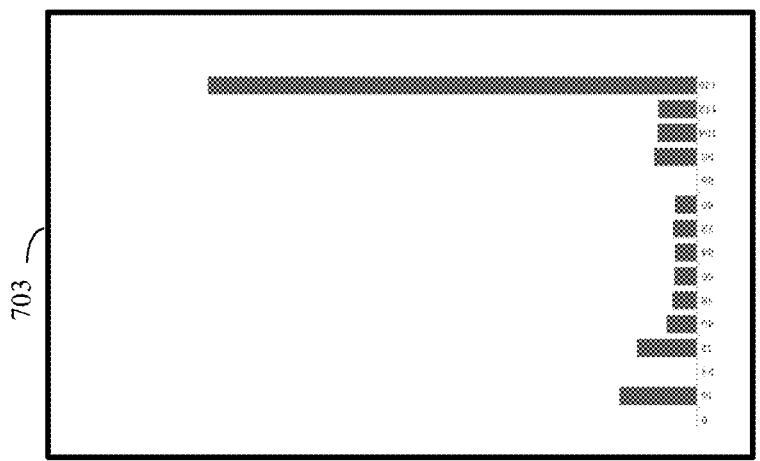
Figure 7A:
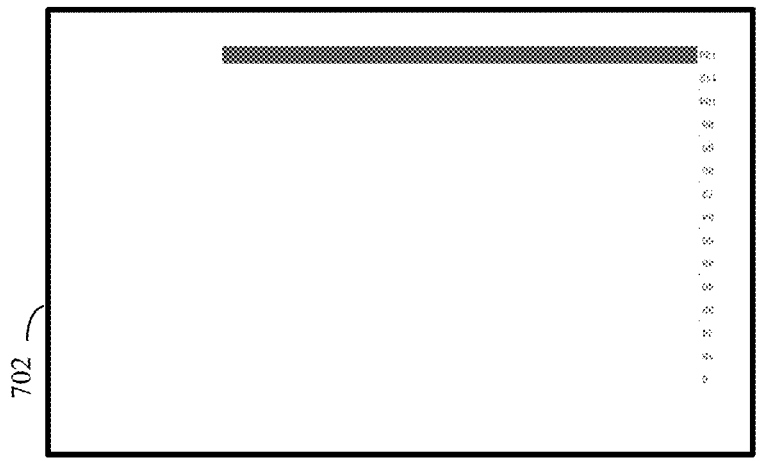

Referring to FIGS. 7A-7C, a plurality of histograms 702-704 illustrate compression distributions for different processes. Each of the histograms 702-704 represents a specific instance of a process running in the federated system. Each of the columns of the histograms 702-704 represent an amount of compression of a 128 k byte track of data so that, for example, the column to the far right of each of the histograms 702-704 represents no compression achieved (i.e., 128 kb of data was "compressed" to 128 kb of data). On the other hand, the column on the far left of the histograms 702-704 represents compressing a 128 kb track to 8 kb of data (or less). The height of each bar in each column represents a number of occurrences (writes) exhibiting the particular compression represented by the column. Thus, for example, the histogram 702 indicates that none of the writes for the process corresponding to the histogram 702 exhibited any compression. Note that this could be because compression was not invoked by the corresponding process or because the particular data written by the process did compression well (did not compress at all, actually). In contrast, the histograms 703, 704 show that some of the data written by a corresponding process was able to be compressed. The histogram 704 shows significant compression at around 48 kb, meaning that a significant amount of the data for the process was able to be compressed from 128 kb to 48 kb.

As discussed in more detail elsewhere herein, the histogram data allows determination of an effective data compression rate for a corresponding process along with Bayesian probability of achieving the compression rate. For example, if it is desirable to achieve 2:1 data compression rate, observing a significant 3:1 data reduction rate, such as in the histogram 704, would be considered a nearly 100% chance of achieving 2:1 compression since the desired 2:1 rate is exceeded. The data compression rate may be derived from a model such as the histograms 702-704 and a probability of achieving a particular compression rate may be based on how well a current sample matches the model. For example, the mode in the histogram 704 shifting from 48 k to 72 k would result in a lower probability of achieving a 2:1 compression rate because the higher value for the mode dilutes the data reduction.

Figure 8:
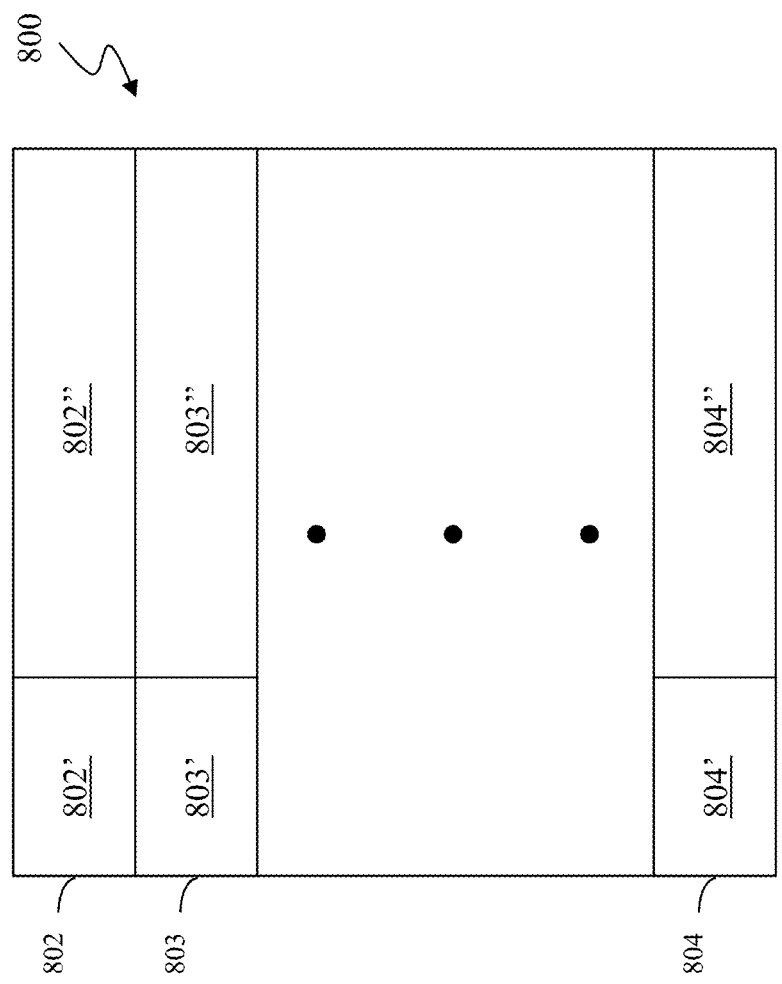
FIG. 8 is a schematic illustration showing a process name table having a plurality of entries according to an embodiment of the system described herein.

Referring to FIG. 8, a process name table 800 includes a plurality of entries 802-804 corresponding to all of the processes running in the federated system or possibly just a subset of the processes that generate the most writes. The process name table 800 may be maintained by the host system 22", described above, that receives the data indicative of an amount of data compression achieved, an identifier of a process that wrote the data, a client that wrote the data, and an industry (e.g., finance, manufacturing, health care, etc.) of the client. Each of the entries includes unique process information such as a process identifier (process name) and corresponding client and industry information and includes histogram data. Thus, for example, the entry 802 includes process information 802' and corresponding histogram data 802", the entry 803 includes process information 803' and corresponding histogram data 803", and the entry 804 includes process information 804' and corresponding histogram data 804".

The system described herein provides an ability to learn from the experience of other, prior, processes. That is, prediction of data reduction to be achieved by a prospective process is based on previous experience with respect to the closest analog to the prospective process. Of course, other clients that use the same process are a good predictor and other clients that use the same process in the same industry is an even better predictor. Based on the experience of different processes over time, the system generates the histograms that represent expected data reduction along with a Bayesian probability of achieving the reduction.

As discussed elsewhere herein, a process identifier (process name), by itself, may not be an effective predictor for compressibility in all cases. For example, a specific process being used for banking may experience different data reduction rates than the same process being used for manufacturing. To account for this, the process name table 800 includes information regarding industry and customer name. Of course, a best predictor for expected compression of a particular process would be the same process being run by the same customer.

Figure 9:
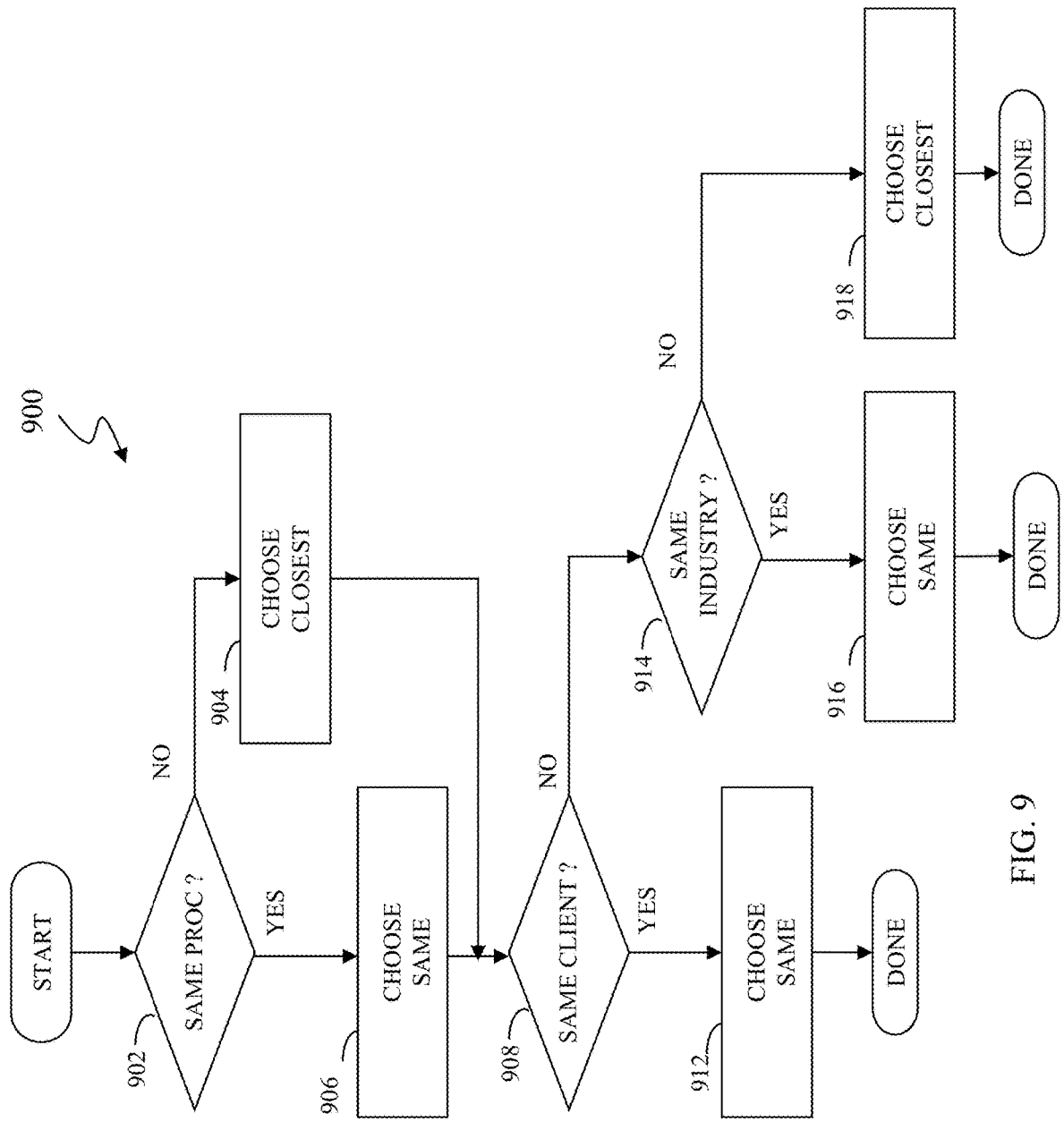
FIG. 9 is a flow diagram illustrating processing performed in connection with determining an entry in a process name table that most closely matches a prospective process according to an embodiment of the system described herein.

Referring to FIG. 9. a flow diagram 900 illustrates processing performed in connection with determining an entry in the process name table 800 that most closely matches a prospective process to predict an expected data compression for the prospective process. The processing illustrated by the flow diagram 900 may be performed by the host system 22" in response to a request/inquiry from another host system. For example, a client may decide to run a new process and may be interested in data compression. In connection with this, the client may present a prospective process to the host system 22" to obtain a prediction of expected data compression. Based on the prediction, the client may then decide whether to incur the overhead of compression or to forgo compression altogether. For instance, if the host system 22" determines that the histogram that is closest to the prospective process is the histogram 702, where no compression occurs, as discussed above, the client may decide to forgo data compression. Note that the system described herein lends itself to automation where a decision to use compression for a prospective process may be based on results returned by the host system 22" and thus the determination to use compression may be automated.

Processing for the flow diagram 900 begins at a first step 902 where it is determined if the prospective process is the same as one or more processes already stored in the process name table 800. That is, has the system already determined compression statistics for the same process as the prospective process. If not, then control transfers from the test step 902 to a step 904 where the system chooses one or more entries in the process name table 800 corresponding to one or more processes that are closest to the prospective process. Determining the closest process at the step 904 may be performed using any appropriate mechanism, including matching process category (e.g., general ledger accounting processes) and/or possibly even a table that provides correlation of well know processes. If it is determined at the step 902 that the prospective process is the same as one or more processes already stored in the process name table 800, then control transfers from the test step 902 to the step 906 where entries in the process name table 800 for the same process as the prospective process are selected.

Following the step 904 or the step 906 is a test step 908 where it is determined if any of the entries selected at the step 904 or at the step 906 are for the same client as the prospective process. If so, then control transfers from the step 908 to the step 912 to choose an entry with the same client. Following the step 912, processing is complete. Once an entry has been selected at the step 912, the requesting process may examine the corresponding histogram data to determine the viability of compressing the data of the prospective process, as described in more detail elsewhere herein.

If it is determined at the test step 908 that none of the entries selected at the step 904 or the step 906 are for the same client as the prospective process, then control transfers from the test step 908 to a test step 914 where it is determined if any of the entries selected at the step 904 or the step 906 are for the same industry as the prospective process. If there is no match for the client at the step 908, the system determines if there is a match for the industry at the step 914. If so, then control transfers from the test step 914 to a step 916 to choose an entry in the process name table 800 from the same industry as the prospective process. Following the step 916, processing is complete. Once an entry has been selected at the step 916, the requesting process may examine the corresponding histogram data to determine the viability of compressing the data of the prospective process, as described in more detail elsewhere herein.

If it is determined at the test step 914 that none of the entries selected at the step 904 or the step 906 are for the same industry as the prospective process, then control transfers from the test step 914 to a step 918 where the system chooses an entry in the process name table 800 corresponding to a process from an industry that is closest to the prospective process. Determining the closest industry at the step 918 may be performed using any appropriate mechanism, including matching industry category (e.g., financial-related industries) and/or possibly even a table that provides correlation of well know industries (e.g., financial planning and accounting). Following the step 918, processing is complete. Once an entry has been selected at the step 918, the requesting process may examine the corresponding histogram data to determine the viability of compressing the data of the prospective process, as described in more detail elsewhere herein.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of the system described herein may include executable code that is stored in a non-transitory computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SD card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of determining an expected compression rate for a prospective process in a federated system including a plurality of host systems, comprising:
   obtaining compression rate data for existing processes in the federated system;
   compiling the compression rate data into a plurality of entries in a process name table according to process identifier, client, and industry, each entry specifying a process identifier of a process executing on one of the host systems and a client who owns the process, and specifying a compression rate indicating an amount of data compression achieved when the process writes data from the host system to a storage device on the federated system;
   determining a specific entry in the process name table for an existing process that most closely matches the prospective process; and
   determining an expected compression rate of the prospective process based on the compression rate data for the specific entry.

2. A method, according to claim 1, wherein compression rate data is provided by a driver at host systems that sends compression rate information to a central repository.

3. A method, according to claim 2, wherein the central repository is provided by a host system at a data center of the federated system.

4. A method, according to claim 1, wherein matching an entry in the process name table includes matching a process identifier and matching a client.

5. A method, according to claim 4, wherein, in response to there being no matching process, choosing an entry in the process name table having a closest process to the prospective process.

6. A method, according to claim 1, wherein matching an entry in the process name table includes matching a process identifier and matching an industry.

7. A method, according to claim 6, wherein, in response to there being no matching industry, choosing an entry in the process name table having a closest industry to that of the prospective process.

8. A method, according to claim 1, wherein the compression rate data uses a sliding average that weighs the data more heavily to favor more recent data.

9. A method, according to claim 1, wherein the compression rate data is provided as histogram data.

10. A method, according to claim 9, wherein the expected compression rate is based on a mode of histogram data.

11. A non-transitory computer readable medium containing software that determines an expected compression rate for a prospective process in a federated system including a plurality of host systems, the software comprising:
    executable code that obtains compression rate data for existing processes in the federated system;
    executable code that compiles the compression rate data into a plurality of entries in a process name table according to process identifier, client, and industry, each entry specifying a process identifier of a process executing on one of the host systems and a client who owns the process, and specifying a compression rate indicating an amount of data compression achieved when the process writes data from the host system to a storage device on the federated system;
    executable code that determines a specific entry in the process name table for an existing process that most closely matches the prospective process; and
    executable code that determines an expected compression rate of the prospective process based on the compression rate data for the specific entry.

12. A non-transitory computer readable medium, according to claim 11, wherein compression rate data is provided by a driver at host systems that sends compression rate information to a central repository.

13. A non-transitory computer readable medium, according to claim 12, wherein the central repository is provided by a host system at a data center of the federated system.

14. A non-transitory computer readable medium, according to claim 11, wherein matching an entry in the process name table includes matching a process identifier and matching a client.

15. A non-transitory computer readable medium, according to claim 14, wherein, in response to there being no matching process, choosing an entry in the process name table having a closest process to the prospective process.

16. A non-transitory computer readable medium, according to claim 11, wherein matching an entry in the process name table includes matching a process identifier and matching an industry.

17. A non-transitory computer readable medium, according to claim 16, wherein, in response to there being no matching industry, choosing an entry in the process name table having a closest industry to that of the prospective process.

18. A non-transitory computer readable medium, according to claim 11, wherein the compression rate data uses a sliding average that weighs the data more heavily to favor more recent data.

19. A non-transitory computer readable medium, according to claim 11, wherein the compression rate data is provided as histogram data.

20. A non-transitory computer readable medium, according to claim 19, wherein the expected compression rate is based on a mode of histogram data.

* * * * *